(12) United States Patent
Sakai

(10) Patent No.: US 11,508,682 B2
(45) Date of Patent: Nov. 22, 2022

(54) CONNECTION ELECTRODE AND METHOD FOR MANUFACTURING CONNECTION ELECTRODE

(71) Applicant: Murata Manufacturing Co., Ltd., Nagaokakyo (JP)

(72) Inventor: Ryosuke Sakai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/203,847

(22) Filed: Mar. 17, 2021

(65) Prior Publication Data

US 2021/0202424 A1 Jul. 1, 2021

Related U.S. Application Data

(63) Continuation of application No. PCT/JP2019/034537, filed on Sep. 3, 2019.

(30) Foreign Application Priority Data

Sep. 28, 2018 (JP) .............................. JP2018-183255

(51) Int. Cl.
*H01L 23/00* (2006.01)
*H01L 21/768* (2006.01)
(Continued)

(52) U.S. Cl.
CPC ........ *H01L 24/14* (2013.01); *H01L 21/76802* (2013.01); *H01L 23/12* (2013.01); *H01L 23/32* (2013.01); *H01L 23/481* (2013.01)

(58) Field of Classification Search
CPC ... H01L 24/14; H01L 21/76802; H01L 23/12; H01L 23/32; H01L 23/481;
(Continued)

(56) References Cited

U.S. PATENT DOCUMENTS 5,336,547 A * 8/1994 Kawakita .............. H01L 21/563
428/209
5,611,481 A * 3/1997 Akamatsu ............... H01L 24/13
228/123.1
(Continued)

FOREIGN PATENT DOCUMENTS

JP 11145174 A * 5/1999 ............ H01L 24/05
JP 11-233542 A 8/1999
(Continued)

OTHER PUBLICATIONS

Official Communication issued in International Patent Application No. PCT/JP2019/034537, dated Oct. 8, 2019.

*Primary Examiner* — Mamadou L Diallo
(74) *Attorney, Agent, or Firm* — Keating & Bennett, LLP

(57) ABSTRACT

A connection electrode includes a first metal film, a second metal film, a mixed layer, and an extraction electrode. The second metal film is located on the first metal film, and the extraction electrode is located on the second metal film. The mixed layer includes a mix of metal particles of the first and second metal films. As viewed in a first direction in which the first metal film and the second metal film are on top of each other, at least a portion of the mixed layer is in a first region that overlaps a bonding plane between the extraction electrode and the second metal film.

17 Claims, 4 Drawing Sheets

(51) Int. Cl.
*H01L 23/12* (2006.01)
*H01L 23/32* (2006.01)
*H01L 23/48* (2006.01)

(58) Field of Classification Search
CPC ... H01L 23/49816; H01L 24/13; H01L 24/03; H01L 24/05; H01L 2221/1078; H01L 2224/02126; H01L 2224/0215; H01L 2224/0345; H01L 2224/0346; H01L 2224/03552; H01L 2224/03848; H01L 2224/0391; H01L 2224/0401; H01L 2224/05076; H01L 2224/05083; H01L 2224/05124; H01L 2224/05144; H01L 2224/05147; H01L 2224/05155; H01L 2224/05166; H01L 2224/05169; H01L 2224/05171; H01L 2224/05556; H01L 2224/05647; H01L 2224/05655; H01L 2224/13022; H01L 2224/131; H01L 21/7685; H01L 21/76858; H01L 23/53238; H01L 23/53223
See application file for complete search history.

(56) References Cited

U.S. PATENT DOCUMENTS

| | | | |
|---|---|---|---|
| 2008/0311683 A1* | 12/2008 | Wang | H01L 27/11502 257/E21.208 |
| 2009/0053538 A1* | 2/2009 | Ma | H01L 21/7685 428/457 |
| 2009/0154132 A1* | 6/2009 | Okamoto | H01L 25/105 156/228 |
| 2011/0095423 A1* | 4/2011 | Ohashi | H01L 23/49816 257/737 |
| 2011/0169517 A1* | 7/2011 | Kim | G01R 3/00 324/756.03 |
| 2015/0194948 A1 | 7/2015 | Inate | |
| 2016/0163668 A1* | 6/2016 | Hine | H05K 3/3463 174/257 |
| 2018/0166630 A1* | 6/2018 | Tada | H01L 45/1253 |

FOREIGN PATENT DOCUMENTS

| | | |
|---|---|---|
| JP | 2011-029314 A | 2/2011 |
| JP | 5510695 B1 | 6/2014 |
| WO | 2014/050307 A1 | 4/2014 |

\* cited by examiner

SECOND DIRECTION

SECOND DIRECTION

CONNECTION ELECTRODE AND METHOD FOR MANUFACTURING CONNECTION ELECTRODE

CROSS REFERENCE TO RELATED APPLICATIONS

This application claims the benefit of priority to Japanese Patent Application No. 2018-183255 filed on Sep. 28, 2018 and is a Continuation Application of PCT Application No. PCT/JP2019/034537 filed on Sep. 3, 2019. The entire contents of each application are hereby incorporated herein by reference.

BACKGROUND OF THE INVENTION

1. Field of the Invention

The present invention relates to a connection electrode of an electronic component and to a manufacturing method therefor.

2. Description of the Related Art

Japanese Patent No. 5510695 describes a structure of a connection electrode of an acoustic wave device. In the structure of the connection electrode described in Japanese Patent No. 5510695, an electrode land is formed on a substrate, and a metal film is formed on the electrode land. Additionally, an under-bump metal is formed on the metal film.

The metal film (first metal film) described in Japanese Patent No. 5510695 may have another metal film (second metal film) formed thereon, and the under-bump metal may be formed on the second metal film. With this configuration in which a plurality of metal films are stacked, various effects may be achieved which cannot be easily achieved with a configuration in which only one metal film is formed.

However, with the configuration in which a plurality of metal films are stacked, a surface of the first metal film may get oxidized. This increases electrical resistance at the bonding portion between the first metal film and the second metal film. As a result, the electrical resistance of the connection electrode increases and electrical characteristics are degraded.

SUMMARY OF THE INVENTION

Preferred embodiments of the present invention provide connection electrodes that each include a plurality of metal films that are stacked and in each of which degradation of electrical characteristics is able to be reduced or prevented, and methods for manufacturing the connection electrodes.

A connection electrode according to a first preferred embodiment of the present invention includes a first metal film, a second metal film, an extraction electrode, and a mixed layer. The first metal film is provided on a principal surface of a wiring electrode. The second metal film is provided on a surface of the first metal film opposite a contact surface thereof in contact with the wiring electrode. The extraction electrode is provided on a surface of the second metal film opposite a contact surface thereof in contact with the first metal film. The mixed layer is a layer in which first metal particles of the first metal film and second metal particles of the second metal film are mixed. As viewed in a first direction in which the first metal film, the second metal film, and the extraction electrode are provided on top of each other, at least a portion of the mixed layer is provided in a first region that overlaps a bonding plane between the extraction electrode and the second metal film.

With this configuration, in which the mixed layer including the first metal particles and the second metal particles is provided in the first metal film and the second metal film, resistivity at a portion directly below the extraction electrode is reduced. This reduces resistance in a path extending from the wiring electrode, passing through the first metal film and the second metal film, and connected to the extraction electrode.

With preferred embodiments of the present invention, in the connection electrodes each including a plurality of metal films that are stacked, degradation of electrical characteristics is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
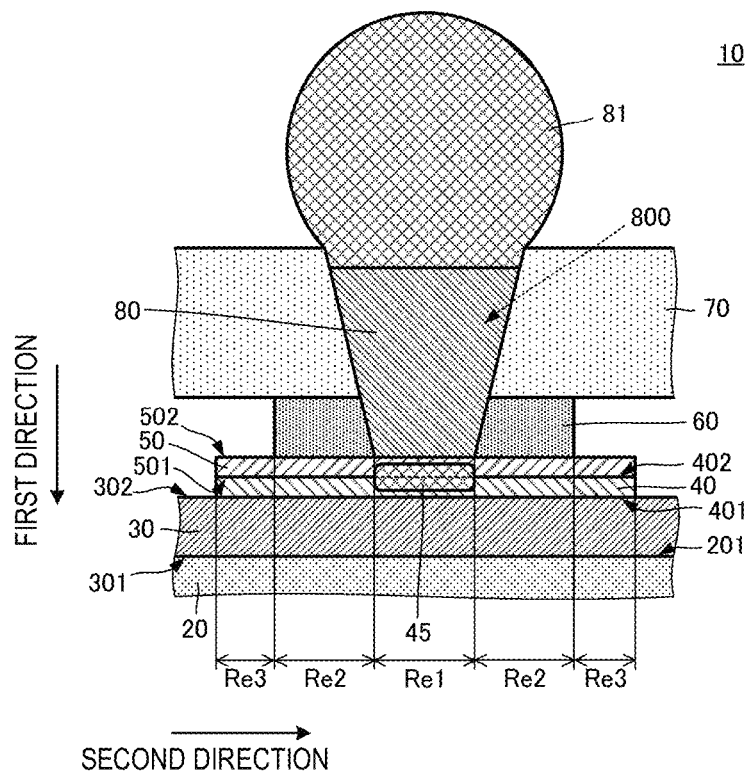
FIG. 1 is a lateral cross-sectional view illustrating a configuration of a connection electrode according to a preferred embodiment of the present invention.
Figure 2:
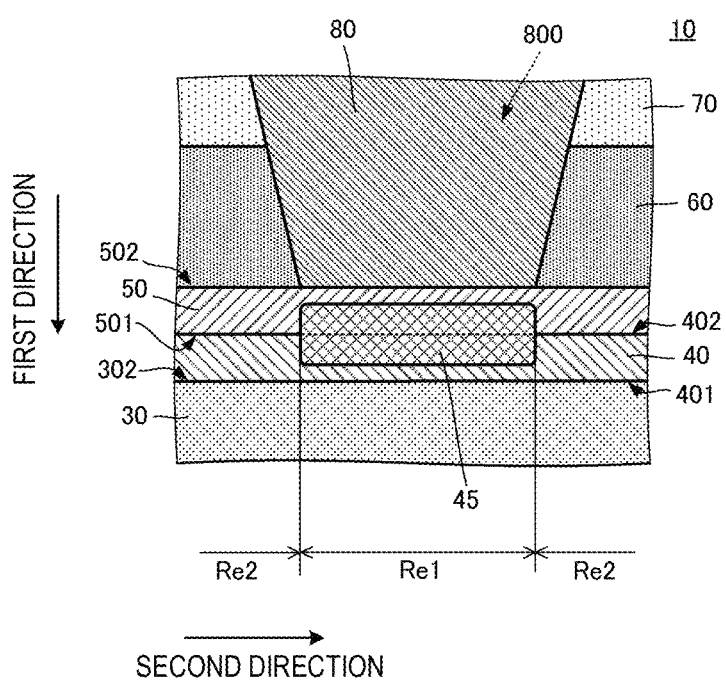
FIG. 2 is an enlarged lateral cross-sectional view of a portion of the connection electrode.

Connection electrodes according to preferred embodiments of the present invention and methods for manufacturing the connection electrodes will now be described with reference to the drawings. FIG. 1 is a lateral cross-sectional view illustrating a configuration of a connection electrode according to a preferred embodiment of the present invention. FIG. 2 is an enlarged lateral cross-sectional view of a portion of the connection electrode of FIG. 1.

As illustrated in FIG. 1 and FIG. 2, an electronic component 10 including a connection electrode according to the present preferred embodiment includes a substrate 20, a wiring electrode 30, a metal film 40, a metal film 50, a support frame 60, a cover layer 70, an under-bump metal 80 (hereinafter referred to as UBM 80), and a solder ball 81. A portion including the metal film 40, the metal film 50, and the UBM 80 corresponds to a connection electrode.

The substrate 20 is, for example, a flat plate including a planar principal surface 201. While not shown, when the substrate 20 is a flat plate, the substrate 20 includes another principal surface opposite the principal surface 201. Examples of the substrate 20 include a piezoelectric substrate, a semiconductor substrate, and an insulating substrate. If the substrate 20 is a piezoelectric substrate, the piezoelectric substrate includes, for example, an IDT electrode provided thereon. If the substrate 20 is a semiconductor substrate, the semiconductor substrate includes, for example, a diode, a transistor, and an FET provided thereon. If the substrate 20 is an insulating substrate, the insulating substrate includes, for example, a conductor pattern provided thereon which provides a predetermined electric circuit.

The wiring electrode 30 is provided on the principal surface 201 of the substrate 20. The wiring electrode 30 has a flat film shape and includes a principal surface 301 and a principal surface 302 opposite each other. The principal surface 301 is in contact with the principal surface 201 of the substrate 20. The principal surface 302 of the wiring electrode 30 is opposite the surface thereof in contact with the substrate 20.

The wiring electrode 30 is made of a material with relatively low resistivity, such as aluminum (Al) or copper (Cu), for example. Among various metals, a metal with relatively low resistivity is, for example, a metal that falls in the category of metals with low resistivities. That is, it is only required that the resistivity of the wiring electrode 30 is within a practical range, in accordance with the specifications of the electronic component 10. The resistivity of the wiring electrode 30 is preferably lower than the resistivity of the metal film 40 and the resistivity of the metal film 50. This can reduce wiring resistance to the substrate 20 and improve electrical characteristics of the electronic component 10. The wiring electrode 30 is preferably made of an easily workable material. For example, aluminum (Al) or copper (Cu) of the wiring electrode 30 corresponds to third metal particles.

The wiring electrode 30 is connected to an electrode, such as an IDT electrode, or to a conductor pattern by, for example, wires not shown in FIG. 1.

The metal film 40 is provided on the principal surface 302 of the wiring electrode 30. The metal film 40 has a flat film shape and includes a principal surface 401 and a principal surface 402 opposite each other. The principal surface 401 is in contact with the principal surface 302 of the wiring electrode 30. The principal surface 402 of the metal film 40 is opposite the surface thereof in contact with the wiring electrode 30.

The metal film 40 is formed, for example, by vapor deposition, plating, or sputtering. The thickness of the metal film 40 (or the length thereof in the first direction in FIG. 1 and FIG. 2) is smaller than the thickness of the wiring electrode 30.

The metal film 40 is preferably made of, for example, titanium (Ti), nickel (Ni), or chromium (Cr). The metal film 40 improves adhesion between the wiring electrode 30 and the metal film 50. A material for the metal film 40 is selected appropriately in accordance with the material of the wiring electrode 30 and the material of the metal film 50. The metal film 40 corresponds to a first metal film. For example, titanium (Ti), nickel (Ni), or chromium (Cr) of the metal film 40 corresponds to first metal particles.

The metal film 50 is provided on the principal surface 402 of the metal film 40. The metal film 50 has a flat film shape and includes a principal surface 501 and a principal surface 502 opposite each other. The principal surface 501 is in contact with the principal surface 402 of the metal film 40. The principal surface 502 of the metal film 50 is opposite the surface thereof in contact with the metal film 40.

The metal film 50 is formed, for example, by vapor deposition, plating, or sputtering. The thickness of the metal film 50 (or the length thereof in the first direction in FIG. 1 and FIG. 2) is smaller than the thickness of the wiring electrode 30.

The metal film 50 is preferably made of, for example, platinum (Pt) or gold (Au). The metal film 50 is a film relatively resistant to oxidation. Among various metals, a metal relatively resistant to oxidation is, for example, a metal that falls in the category of metals resistant to oxidation. That is, it is only required that the metal film 50 is resistant to oxidation to an extent that is practical for the function of the metal film 50, in accordance with the specifications of the electronic component 10. The metal film 50 corresponds to a second metal film. Also, for example, platinum (Pt) or gold (Au) of the metal film 50 corresponds to second metal particles. It is thus possible to reduce oxidation of the surface of the metal film 50 during formation of the UBM 80 (described below).

The support frame 60 is provided on the principal surface 502 of the metal film 50. The support frame 60 is columnar. For example, the support frame 60 is preferably made of an insulating ceramic, such as silicon oxide ($SiO_2$) or aluminum oxide ($Al_2O_3$), or of a synthetic resin, such as polyimide or epoxy resin.

The cover layer 70 is provided on a surface of the support frame 60 opposite the surface thereof in contact with the metal film 50. The cover layer 70 covers, for example, the entire or substantially the entire surface of the electronic component 10 including the wiring electrode 30, the metal film 40, and the metal film 50 provided thereon. For example, the cover layer 70 is preferably made of an insulating ceramic, such as aluminum oxide ($Al_2O_3$), a synthetic resin, such as polyimide or epoxy resin, a piezoelectric material, such as lithium tantalate ($LiTaO_3$) or lithium niobate ($LiNbO_3$), or a semiconductor material, such as silicon (Si).

The support frame 60 and the cover layer 70 include a through hole 800 penetrating therethrough in the direction of thickness (or the first direction in FIG. 1). The metal film 50 provides a bottom to the through hole 800.

The UBM 80 includes the through hole 800. The UBM 80 is preferably made of, for example, nickel (Ni) or copper (Cu). The UBM 80 is connected to the metal film 50 at the bottom of the through hole 800. At least a portion of the UBM 80 is provided inside the support frame 60. The UBM 80 corresponds to an extraction electrode.

The solder ball 81 is provided on the surface of the UBM 80.

In this configuration, as illustrated in FIG. 1 and FIG. 2, a mixed layer 45 is provided in the metal film 40 and the metal film 50. The mixed layer 45 is a layer in which metal particles P40 of the metal film 40 and metal particles P50 of the metal film 50 are mixed. For example, the mixed layer 45 preferably satisfies the following conditions.

Figure 3:
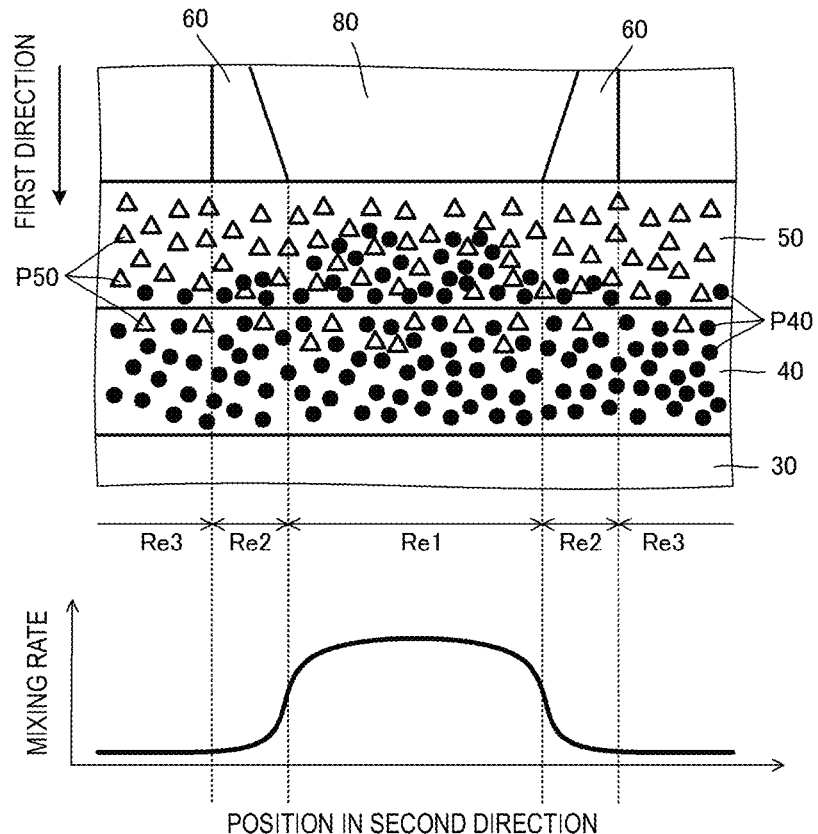
FIG. 3 is a diagram schematically illustrating how metal particles P40 and P50 are mixed.

FIG. 3 is a diagram schematically illustrating how metal particles are mixed. Specifically, as illustrated in FIG. 3, the mixed layer 45 is a layer in which the mixing rate of the metal particles P40 of the metal film 40 and the metal particles P50 of the metal film 50 is higher than a normal mixing rate of the metal particles P40 and the metal particles P50 in the vicinity of a bonding interface between the metal film 40 and the metal film 50. More specifically, the mixing rate is expressed as the mixing rate (or diffusivity) of the metal particles P40 per unit volume in the metal film 50 in the vicinity of the interface. Alternatively, the mixing rate is expressed as the mixing rate (or diffusivity) of the metal particles P50 per unit volume in the metal film 40 in the vicinity of the interface.

As illustrated in FIG. 3, in the connection electrode of the electronic component 10 according to the present preferred embodiment, the mixing rate is high in a first region Re1 that overlaps the bonding plane between the UBM 80 and the metal film 50 as viewed in the first direction. Of regions not overlapping the bonding plane between the UBM 80 and the metal film 50, a second region Re2 has a mixing rate that increases toward the first region Re1 and decreases toward a third region Re3. Of the regions not overlapping the bonding plane between the UBM 80 and the metal film 50, the third region Re3 is located opposite the first region Re1, with the second region Re2 interposed therebetween, as viewed in a second direction (which is parallel or substantially parallel to contact surfaces of the metal film 40 and the metal film 50) in FIG. 1. The mixing rate in the third region Re3 is low and constant or substantially constant.

As illustrated in FIG. 1 and FIG. 2, the first region Re1 overlaps the mixed layer 45 in the connection electrode of the electronic component 10 according to the present preferred embodiment. That is, at least a portion of the mixed layer 45 is provided in the first region Re1.

In this configuration, the mixed layer 45 exists directly below the UBM 80. That is, the mixed layer 45 exists in a current transmission path (or main transmission path) extending from the UBM 80, passing through the metal film 50 and the metal film 40, and connected to the wiring electrode 30. The mixed layer 45 has low resistivity, because it is in the state of metal diffusion. This reduces the electrical resistance of a portion extending from the UBM 80, passing through the metal film 50 and the metal film 40, and connected to the wiring electrode 30. Therefore, for example, even when the principal surface 402 of the metal film 40 gets oxidized in the process of manufacturing the electronic component 10, and this leads to increased electrical resistance of the connection electrode, the presence of the mixed layer 45 reduces the electrical resistance of the connection electrode and reduces degradation of electrical characteristics of the electronic component 10.

As illustrated in FIG. 3, on the other hand, the third region Re3 does not overlap the mixed layer 45. Specifically, the mixing rate of the metal particles P40 and the metal particles P50 in the third region Re3 is a constant or substantially constant value much lower than the mixing rate of the metal particles P40 and the metal particles P50 in the first region Re1. That is, the mixed layer 45 is not provided in the third region Re3. This constant value is "a normal mixing rate of the metal particles P40 and the metal particles P50 in the vicinity of a bonding interface between the metal film 40 and the metal film 50" described above. Since the mixed layer 45 is not provided in the third region Re3, which is the outer edge of the connection electrode, degradation of bonding strength between the metal film 40 and the metal film 50 can be reduced.

The mixed layer 45 may be provided in a portion of the second region Re2. For example, in the electronic component 10 illustrated in FIG. 3, the mixing rate in the second region Re2, particularly in a portion of the second region Re2 close to the first region Re1, is higher than the mixing rate in the third region Re3 and the same or substantially the same as the mixing rate in the first region Re1. This indicates that the mixed layer 45 is provided in a portion of the second region Re2. In this case, a portion of the second region Re2 including the mixed layer 45 therein is preferably smaller than a portion of the first region Re1 including the mixed layer 45 therein. Note that the portion including the mixed layer 45 therein may be either a planar region (area) or a three-dimensional region (volume), and it is only required that the portions of the first region Re1 and the second region Re2 to be compared are of the same type. Again, as long as the region including the mixed layer 45 therein is smaller than the region not including the mixed layer 45 therein, degradation of bonding strength between the metal film 40 and the metal film 50 can be reduced.

It is more preferable that the mixed layer 45 continuously extends across the boundary between the first region Re1 and the second region Re2. In this case, since a region with low resistance continuously exists along the current transmission path, degradation of electrical characteristics can be reduced more effectively.

The mixed layer 45 may not be provided at all in the second region Re2. That is, the mixing rate in the second region Re2 may be maintained at the same or substantially the same value as the mixing rate in the third region Re3. In this case, in the metal film 40 and the metal film 50, the region including the mixed layer 45 therein is limited only to the first region Re1 in the center of the connection electrode. This can more effectively reduce degradation of bonding strength between the metal film 40 and the metal film 50.

As illustrated in FIG. 1 and FIG. 3, of the regions not overlapping the bonding plane between the UBM 80 and the metal film 50 as viewed in the first direction in FIG. 1, the second region Re2 may be a region overlapping the support frame 60 and the third region Re3 may be a region not overlapping the support frame 60.

The mixed layer 45 is formed by locally heating the metal film 40 and the metal film 50. For example, as described below with reference to FIG. 4 and FIGS. 5A to 5C, the mixed layer 45 is formed in the metal film 40 and the metal film 50 by, for example, irradiating, with laser light, a through hole to accommodate the UBM 80 to be formed therein.

Of the regions in the metal film 40 and the metal film 50, a region that overlaps the support frame 60 including therein at least a portion of the UBM 80, as viewed in the first direction, is at a relatively short distance from the region heated with laser light. This facilitates formation of a mixed layer under the influence of heating with laser light. Therefore, when the region where a mixed layer is more likely to be formed is the second region Re2, a connection electrode that achieves the advantageous effects of preferred embodiments of the present invention are easily obtained.

On the other hand, a region that does not overlap the support frame 60, as viewed in the first direction, is at a relatively long distance from the region heated with laser light and thus is less likely to be influenced by the heating with laser light. Therefore, when the region where a mixed layer is less likely to be formed is the third region Re3, a connection electrode that achieves the advantageous effects of preferred embodiments of the present invention is easily obtained.

As illustrated in FIG. 1 and FIG. 2, the mixed layer 45 preferably does not extend to the principal surface 502 of the metal film 50. The resistivity of the metal film 50, which is resistant to oxidation, is less likely to be increased by oxidation during the manufacturing process. Therefore, even when the mixed layer 45 does not extend to the principal surface 502 of the metal film 50, the electrical resistance of the portion extending from the UBM 80, passing through the metal film 50 and the metal film 40, and connected to the wiring electrode 30 is less likely to increase. Also, due to an absence of the mixed layer 45 in the bonding plane between the principal surface 502 of the metal film 50 and the UBM 80 (i.e., between the metal film 50 and the UBM 80), degradation of bonding strength between the metal film 50 and the UBM 80 can be reduced. This improves bonding reliability between the metal film 50 and the UBM 80.

Also, as illustrated in FIG. 1 and FIG. 2, the mixed layer 45 preferably does not extend to the principal surface 401 of the metal film 40. That is, the mixed layer 45 is preferably absent in the bonding plane between the metal film 40 and the wiring electrode 30. This can reduce degradation of bonding strength between the metal film 40 and the wiring electrode 30, and thus improve bonding reliability between the metal film 40 and the wiring electrode 30.

The mixed layer 45 may extend to the wiring electrode 30. This reduces electrical resistance of the portion extending from the UBM 80, passing through the metal film 50 and the metal film 40, and connected to the wiring electrode 30, and can improve electrical characteristics of the electronic component 10. In this case, the mixed layer 45 is preferably absent in a portion of the bonding interface between the metal film 40 and the wiring electrode 30 overlapping the second region Re2. With this configuration, degradation of bonding strength between the wiring electrode 30 and the metal film 40 can be reduced.

The foregoing description refers to the case where, as illustrated in FIG. 1 and FIG. 2, the mixed layer 45 and the first region Re1 entirely or substantially entirely overlap. However, the electrical resistance can be reduced as long as the mixed layer 45 and the first region Re1 at least partially overlap.

Figure 4:
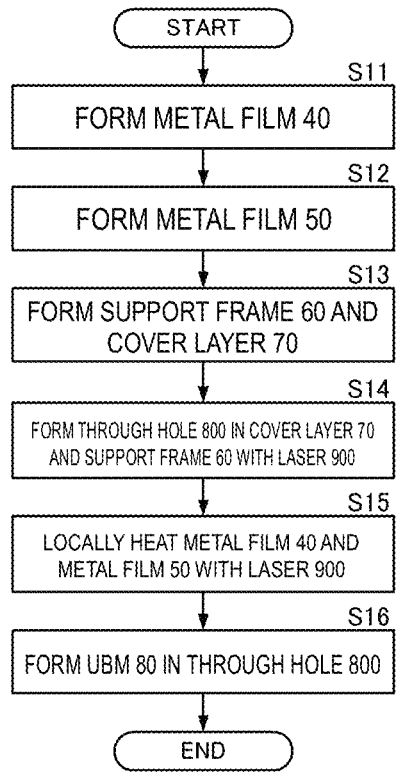
FIG. 4 is a flowchart illustrating a method for manufacturing the connection electrode according to a preferred embodiment of the present invention.
Figure 5A:
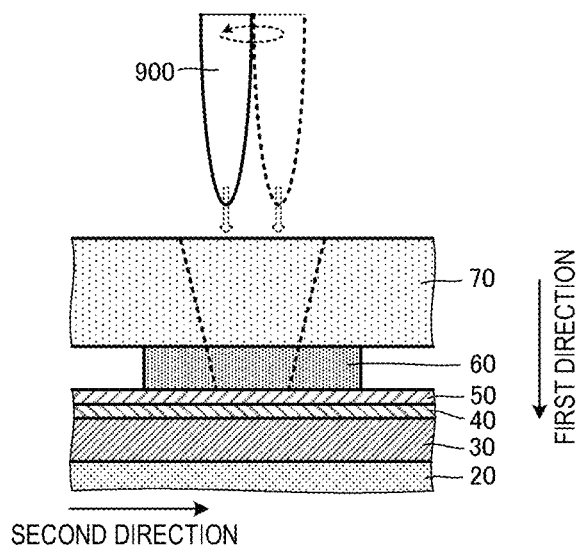
FIGS. 5A to 5C are diagrams illustrating the connection electrode in each step of manufacture.
Figure 5B:
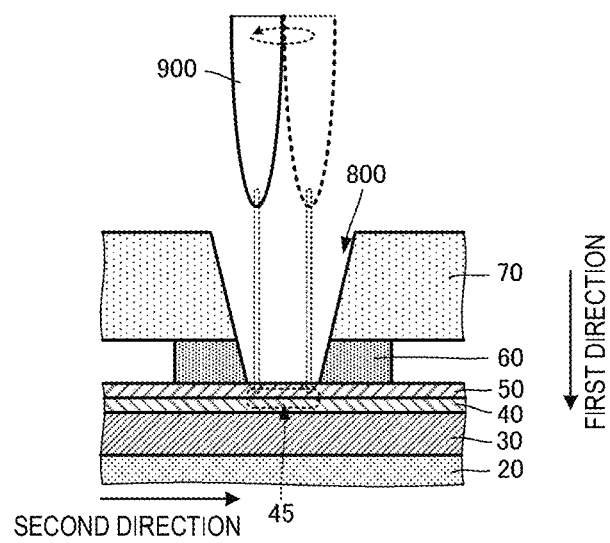
Figure 5C:
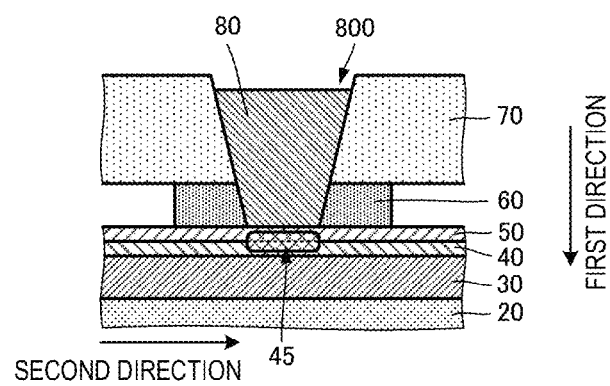

The connection electrode of the electronic component 10 described above may be manufactured by the following non-limiting example method. FIG. 4 is a flowchart illustrating a method for manufacturing the connection electrode according to a preferred embodiment of the present invention. FIGS. 5A to 5C are diagrams illustrating the connection electrode in each step of manufacture. The manufacturing method will now be described with reference to the flowchart of FIG. 4.

The metal film 40 is formed on the principal surface 302 of the wiring electrode 30, for example, by vapor deposition, plating, or sputtering (S11). Next, the metal film 50 is formed on the principal surface 402 of the metal film 40, for example, by vapor deposition, plating, or sputtering (S12). Next, the support frame 60, which is an insulating layer, is formed on the principal surface 502 of the metal film 50, and the cover layer 70 is formed on the support frame 60 (S13).

Next, as illustrated in FIG. 5A, a laser 900 irradiates, with laser light, a surface of the cover layer 70 opposite the surface thereof in contact with the support frame 60. The energy of the laser light is set for grinding the cover layer 70 and the support frame 60. The laser 900 continues to irradiate the cover layer 70 with laser light to grind the cover layer 70, and then to further grind the support frame 60. This creates, as illustrated in FIG. 5B, the through hole 800 that penetrates the cover layer 70 and the support frame 60 (S14).

As illustrated in FIG. 5B, in this state, the principal surface 502 of the metal film 50 is exposed at the bottom of the through hole 800.

The laser 900 irradiates the metal film 50 with laser light, in this state, to locally heat the vicinity of the contact surfaces of the metal film 50 and the metal film 40. The energy of this laser light is set to bring the vicinity of the contact surfaces of the metal film 50 and the metal film 40 to a predetermined temperature. The energy for this local heating may be set to the same or substantially the same level as the energy to form the through hole 800. By continuing the irradiation with laser light over a predetermined period of time, the mixed layer 45 is formed so as to include the contact surfaces of the metal film 50 and the metal film 40 (S15). As described above, the mixed layer 45 is a layer in which the metal particles P50 of the metal film 50 and the metal particles P40 of the metal film 40 are mixed to a greater degree than in a normal stacked state of the metal film 50 and the metal film 40.

Next, as illustrated in FIG. 5C, the UBM 80 is formed in the through hole 800 (S16).

In this manufacturing method, the laser used to form the through hole 800 to accommodate the UBM 80 can be used to form the mixed layer 45. This simplifies the manufacturing process. The manufacturing process can be further simplified, particularly by setting the energy for local heating to the same level as the energy for forming the through hole 800.

FIG. 1 to FIG. 3 illustrate the electronic component 10 in which the wiring electrode includes two metal films stacked thereon. However, the number of metal films stacked on the wiring electrode is not limited to two, and three or more metal films may be stacked. In this case, the mixed layer may be formed at least between a metal film closest to the extraction electrode (e.g., the UBM 80) and another metal film in contact with the metal film closest to the extraction electrode. This can reduce electrical resistance and thus can reduce degradation of electrical characteristics.

Figure 6:
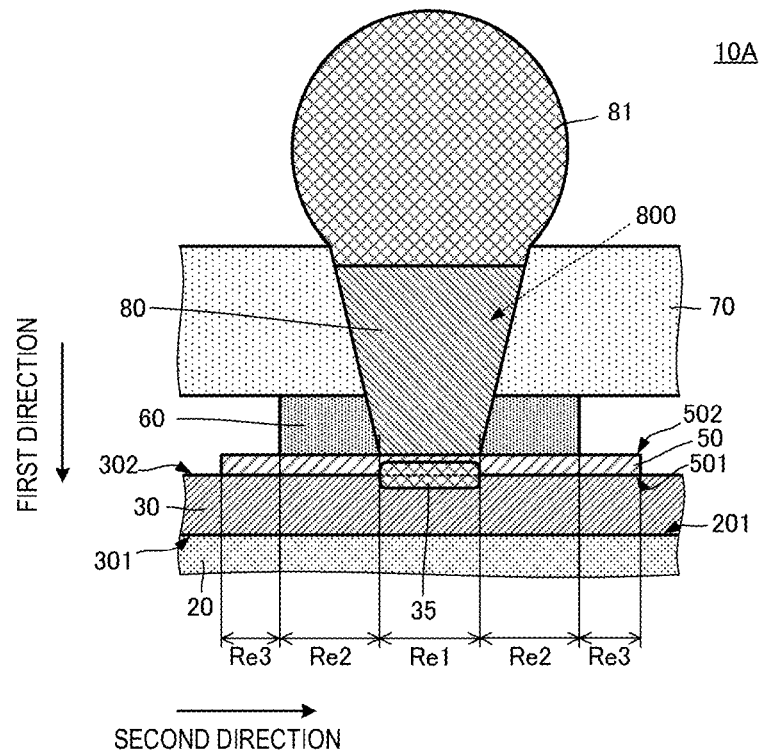
FIG. 6 is a lateral cross-sectional view illustrating an exemplary configuration derived from the configuration of the connection electrode according to a preferred embodiment of the present invention.

As illustrated in FIG. 6, the wiring electrode may include only one metal film provided thereon. FIG. 6 is a lateral cross-sectional view illustrating an exemplary configuration derived from the configuration of the connection electrode according to the above-described preferred embodiment of the present invention.

An electronic component 10A illustrated in FIG. 6 differs from the electronic component 10 illustrated in FIG. 1 in that the metal film 40 defining and functioning as a contact layer is absent, and also differs therefrom in the position where a mixed layer 35 is provided. Otherwise, the configuration of the electronic component 10A is the same as or similar to that of the electronic component 10 and the redundant description will be omitted.

In the electronic component 10A, as illustrated in FIG. 6, the metal film 50 is provided on the principal surface 302 of the wiring electrode 30. This means that the principal surface 501 of the metal film 50 is in contact with the principal surface 302 of the wiring electrode 30.

The mixed layer 35 is provided in the metal film 50 and the wiring electrode 30. The mixed layer 35 include the bonding interface between the metal film 50 and the wiring electrode 30. The mixed layer 35 is a layer in which metal particles of the wiring electrode 30 (corresponding to "third metal particles") and the metal particles of the metal film 50 are mixed. The mixed layer 35 satisfies the same or substantially the same conditions as those for the mixed layer 45, except that the metal particles of the metal film 40 are replaced by the metal particles of the wiring electrode 30.

The mixed layer 35 overlaps the first region Re1. More specifically, at least a portion of the mixed layer 35 is provided in the first region Re1 that overlap the bonding plane between the UBM 80 and the metal film 50.

Even when the metal film 50 is directly provided on the wiring electrode 30, the principal surface of the wiring electrode 30 adjacent to the metal film 50 may still be oxidized. Again, this may increase the electrical resistance and deteriorate electrical characteristics of the electronic component 10A including the wiring electrode 30. However, in the electronic component 10A, which includes the mixed layer 35 between the wiring electrode 30 and the metal film 50, electrical resistance is reduced and degradation of the electrical characteristics can be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A connection electrode comprising:
a first metal film on a principal surface of a wiring electrode;
a second metal film on a surface of the first metal film opposite a contact surface thereof in contact with the wiring electrode;
an extraction electrode on a surface of the second metal film opposite a contact surface thereof in contact with the first metal film; and
a mixed layer in which first metal particles of the first metal film and second metal particles of the second metal film are mixed; wherein
as viewed in a first direction in which the first metal film, the second metal film, and the extraction electrode are on top of each other, at least a portion of the mixed layer is in a first region that overlaps a bonding plane between the extraction electrode and the second metal film; and
as viewed in the first direction, the mixed layer is not provided in a second region that does not overlap the bonding plane between the extraction electrode and the second metal film.

2. The connection electrode according to claim 1, wherein the second metal film is more resistant to oxidation than the first metal film.

3. The connection electrode according to claim 1, wherein, in the first direction, the mixed layer does not extend to a contact surface of the second metal film in contact with the extraction electrode.

4. The connection electrode according to claim 3, wherein, in the first direction, the mixed layer does not extend to the contact surface of the first metal film in contact with the wiring electrode.

5. The connection electrode according to claim 1, wherein the mixed layer extends to the wiring electrode.

6. The connection electrode according to claim 1, wherein a resistivity of the wiring electrode is lower than a resistivity of the first metal film and a resistivity of the second metal film.

7. The connection electrode according to claim 1, wherein
the first metal particles include titanium, nickel, or chromium;
the second metal particles include platinum or gold; and
third metal particles of the wiring electrode include copper or aluminum.

8. A connection electrode comprising:
a first metal film on a principal surface of a wiring electrode;
a second metal film on a surface of the first metal film opposite a contact surface thereof in contact with the wiring electrode;
an extraction electrode on a surface of the second metal film opposite a contact surface thereof in contact with the first metal film; and
a mixed layer in which first metal particles of the first metal film and second metal particles of the second metal film are mixed; wherein
as viewed in a first direction in which the first metal film, the second metal film, and the extraction electrode are on top of each other, at least a portion of the mixed layer is in a first region that overlaps a bonding plane between the extraction electrode and the second metal film;
as viewed in the first direction, the mixed layer is in a portion of a second region that does not overlap the bonding plane between the extraction electrode and the second metal film; and
the portion of the second region in which the mixed layer is provided is smaller than another portion of the second region in which the mixed layer is not provided.

9. The connection electrode according to claim 8, wherein, as viewed in a second direction parallel or substantially parallel to contact surfaces of the first metal film and the second metal film, the mixed layer is not provided in a third region opposite the first region, with the second region interposed therebetween.

10. The connection electrode according to claim 9, further comprising:
a support frame including at least a portion of the extraction electrode, the support frame being provided on the second metal film; wherein
the second region overlaps the support frame as viewed in the first direction; and
the third region does not overlap the support frame as viewed in the first direction.

11. A connection electrode comprising:
a first metal film on a principal surface of a wiring electrode;
an extraction electrode on a surface of the first metal film opposite a contact surface thereof in contact with the wiring electrode; and
a mixed layer in which first metal particles of the first metal film and third metal particles of the wiring electrode are mixed; wherein
as viewed in a first direction in which the first metal film and the extraction electrode are on top of each other, at least a portion of the mixed layer is in a first region that overlaps a bonding plane between the extraction electrode and the first metal film; and
at least a portion of the first metal film overlaps with the mixing layer in a second direction perpendicular or substantially perpendicular to the first direction.

12. The connection electrode according to claim 11, wherein, as viewed in the first direction, the mixed layer is not provided in a second region that does not overlap the bonding plane between the extraction electrode and the first metal film.

13. The connection electrode according to claim 11, wherein, in the first direction, the mixed layer does not extend to a contact surface of the first metal film in contact with the extraction electrode.

14. The connection electrode according to claim 11, wherein the mixed layer extends to the wiring electrode.

15. The connection electrode according to claim 11, wherein
the first metal particles include titanium, nickel, or chromium; and
third metal particles of the wiring electrode include copper or aluminum.

16. The connection electrode according to claim 11, further comprising a support frame including at least a portion of the extraction electrode, the support frame being provided on the first metal film.

17. A method for manufacturing a connection electrode, the method comprising:
- forming a first metal film on a principal surface of a wiring electrode;
- forming a second metal film on a surface of the first metal film opposite a contact surface thereof in contact with the wiring electrode;
- forming an insulating layer covering at least a portion of a surface of the second metal film opposite a contact surface thereof in contact with the first metal film;
- forming a through hole by irradiating the insulating layer with laser light, the through hole allowing exposure of the second metal film;
- forming a mixed layer by irradiating and heating the second metal film and the first metal film with the laser light used to form the through hole, the mixed layer being a layer in which first metal particles of the first metal film and second metal particles of the second metal film are mixed; and
- forming an extraction electrode in the through hole.

* * * * *